United States Patent [19]

Grallert

[11] Patent Number: 4,541,102
[45] Date of Patent: Sep. 10, 1985

[54] HIGH-SPEED DIFFERENCE PULSE CODE MODULATION CODER

[75] Inventor: Hans-Joachim Grallert, Groebenzell, Fed. Rep. of Germany

[73] Assignee: Siemens Aktiengesellschaft, Berlin & Munich, Fed. Rep. of Germany

[21] Appl. No.: 523,610

[22] Filed: Aug. 16, 1983

[30] Foreign Application Priority Data

Sep. 1, 1982 [DE] Fed. Rep. of Germany ....... 3232516

[51] Int. Cl.³ .............................................. H04B 12/04
[52] U.S. Cl. .................................... 375/30; 332/11 D
[58] Field of Search ........................ 375/27, 30, 33, 28; 332/11 R, 11 D; 340/347 AD; 328/151

[56] References Cited

U.S. PATENT DOCUMENTS 4,470,146  9/1984  Yatsuzuka et al. .................... 375/30

OTHER PUBLICATIONS

Principles of Pulse Code Modulation, Cattermole, Iliffe Books, London, 1969, pp. 198–219.
A. J. Goldberg et al., "A Real-Time Adaptive Predictive Coder Using Small Computers", IEEE Transactions on Communications, vol. COM-23, No. 12, Dec. 1975, pp. 1443-1451.

*Primary Examiner*—Benedict V. Safourek
*Attorney, Agent, or Firm*—Hill, Van Santen, Steadman & Simpson

[57] ABSTRACT

A high-speed difference pulse code modulation coder comprises a calculating unit for determining an estimated value, the calculating unit comprising a quantizer which is preceded by three subtractors and has a plurality of outputs for emitting various calculated values. The difference pulse code modulation signal is calculated in a plurality of consecutive steps by way of intermediate values for calculation of a difference pulse code modulation signal, only two calculating steps are required within one period of the pulse code modulation signal to be processed.

6 Claims, 2 Drawing Figures

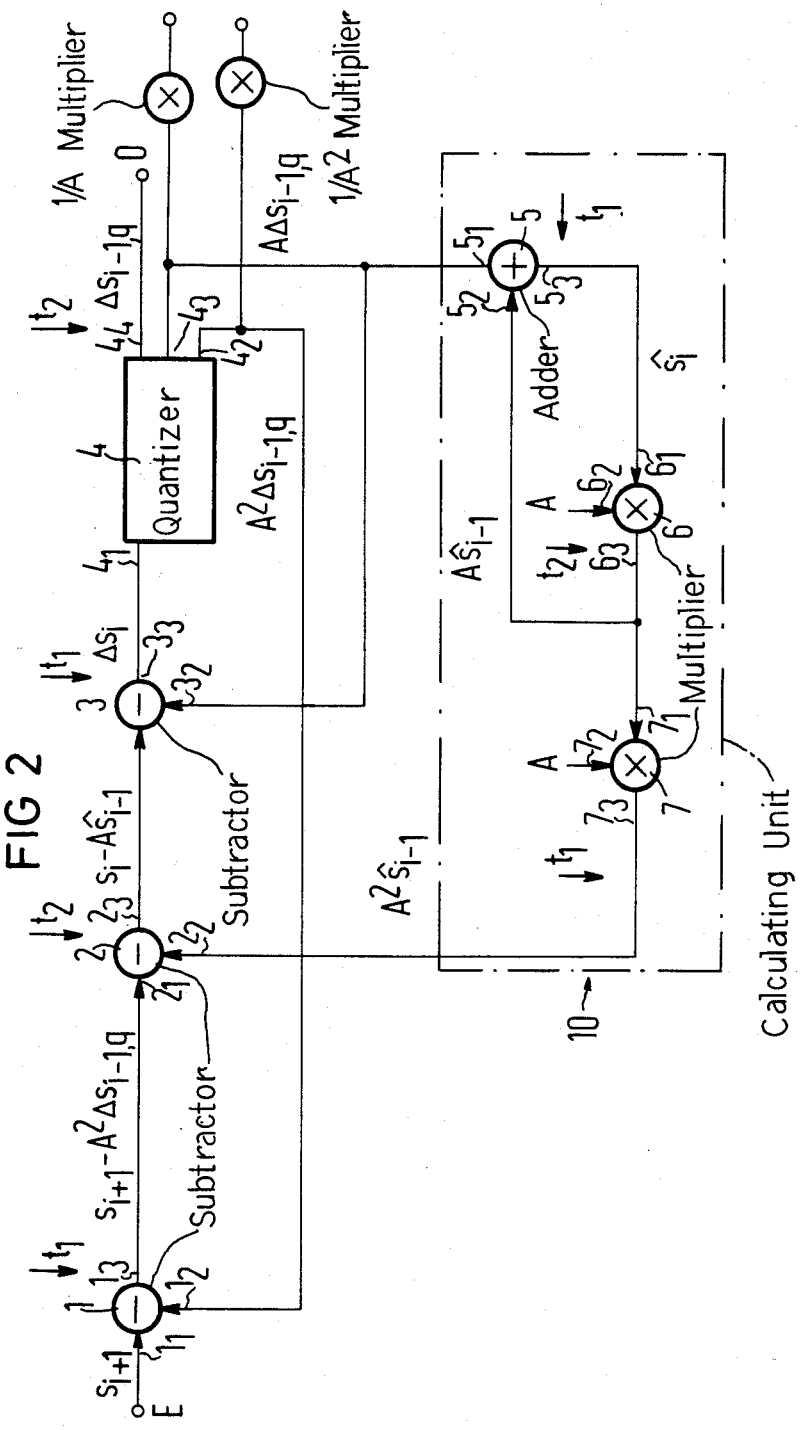

HIGH-SPEED DIFFERENCE PULSE CODE MODULATION CODER

BACKGROUND OF THE INVENTION

1. Field of the Invention

The present invention relates to a high-speed difference pulse code modulation (DPCM) coder, comprising a quantizer and a calculating unit which serves to determine the estimated value and which contains adders, subtractors and multipliers.

2. Description of the Prior Art

The difference pulse code modulation processes frequently used in digital transmission or storage of signals. In this process, an estimated value $s_i$ of a current sample $s_i$ is calculated on the basis of a preceding sample value $s_{i-k}$. The difference $\Delta s_i = s_i - s_i$ is quantized and subsequently transmitted. The aim of the process is to use a shorter word length to represent $\Delta s_i$ then is required to represent the PCM signal values $s_i$. The requisite transmission rate and storage space requirement are therefore reduced. FIG. 1 of the present application illustrates a simple DPCM loop whose function will be explained in greater detail. The estimated value $s_i$ is calculated in four steps. These four calculating steps must be executed within a length of time which corresponds to the interval of time between two consecutive PCM signal values $s_i$, $s_{i+1}$. At high data rates only a short length of time is available for these four calculating operations, which means that it is difficult or impossible to use this process even when the most modern circuit technology is employed.

SUMMARY OF THE INVENTION

The object of the present invention, therefore, is to provide a DPCM coder which requires only a short processing time.

Beginning with the prior art set forth above, the above object is achieved, according to the present invention, in that the quantizer is preceded by three subtractors, that the quantizer is provided with at least two outputs, that the first output from which there is emitted a quantized DPCM signal value multiplied by the square of a prediction factor, leads to the subtraction input of the first subtractor, that the second output of the quantizer, from which there is emitted a quantized DPCM signal value multiplied by the prediction factor, leads to the subtraction input of the third subtractor, and that the second output of the quantizer is additionally connected to the subtraction input of the second subtractor by way of a calculating unit which serves to determine the estimated value multiplied by the square of the prediction factor.

In this DPCM coder, the DPCM signal values are calculated by a parallel calculation of intermediate values which are logically linked to the PCM signal values present at the input of the circuit arrangement in three consecutive calculating operations until the DPCM signal which is still to be quantized occurs. Following every two consecutive calculating operations, a new quantized DPCM signal value occurs at the output of the quantizer. This circuit can be constructed in such a manner that every second consecutive calculating element operates with the same clock pulse rate. Therefore, half of the pulse period of the PCM signal values which are to be processed is available for every calculating operation.

It is advantageous to provide the quantizer with a third output from which the quantized DPCM signal values are emitted.

In this construction, the quantized DPCM signal can be directly obtained from the output of the quantizer.

In order to reduce the expense, it can be advantageous to provide an additional multiplier which is connected to the first or second output of the quantizer and which calculates the quantized DPCM signal value $\Delta s_{i,q}$ by multiplication by $1/A^2$ or $1/A$. In this embodiment, the quantized DPCM signal can be calculated from one of the two signals emitted from the quantizer.

It is advantageous that the calculating unit should contain an adder whose first input is connected to the second output of the quantizer, that the output of the adder should be connected to the first input of the first multiplier whose second input is supplied with the prediction factor and whose output is connected to the second input of the adder and is also connected to the first input of a second multiplier whose second input is likewise supplied with the prediction factor, and that the output of the second multiplier should form the output of the calculating unit.

The calculating loop which is known per se and which serves to determine the estimated value $s_i$ is here used to calculate the requisite value $A^2 \cdot s_{i-1}$.

For reasons of expense, it is advantageous to provide one or more freely-adjustable storage modules by way of a quantizer.

When, for example, a read only memory (ROM) is used as a quantizer, the necessary output signals are recorded in the form of data. The DPCM signal $\Delta s_i$ occurs as an address in the quantizer. When the word length of the ROM (PROM, EPROM, RAM) is sufficient, all the required items of data can be called up simultaneously. For example, the word width of the quantized DPCM signal $\Delta s_{i,q}$ amounts to four bits, whereas the other output items of data each possess a width of 6 bits. In this case, the word width of the ROM would need to amount to 16 bits.

Naturally, it is also possible to use a plurality of memories operated in parallel.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 2 is a schematic representation of a DPCM coder constructed in accordance with the present invention.

DESCRIPTION OF THE PREFERRED EMBODIMENTS

Figure 1:
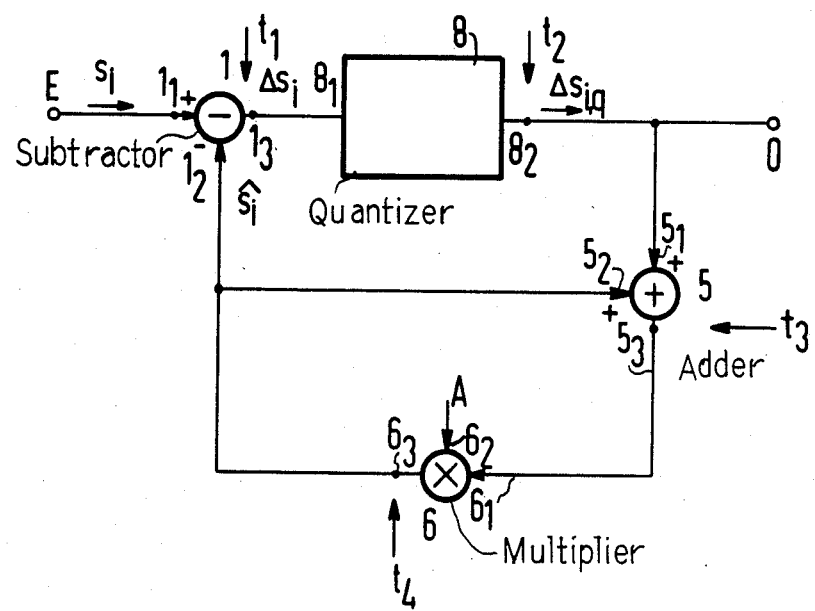
FIG. 1 is a schematic representation of a known DPCM coder.

The DPCM coder illustrated in FIG. 1 comprises a subtractor 1 having an input $1_1$ which represents the input E of the circuit arrangement. An output $1_3$ of the subtractor 1 is connected to an input $8_1$ of a quantizer 8 which has an output $8_2$ representing the output O of the DPCM coder from which the quantized DPCM signal $\Delta s_{i,q}$ is emitted. The output of the quantizer 8 is connected to a first input $5_1$ of an adder 5 which has an output $5_3$ connected to a first input $6_1$ of a multiplier 6 which has an output $6_3$ connected to an input $1_2$ of the subtractor and to the second input $5_2$ of the adder 5. The second input $6_2$ of the multiplier is supplied with a constant prediction factor $A \leq 1$. The input of the circuit is supplied with PCM signal values $s_i$. The time sequence of the signals is characterized by the index "$i$".

The mode of operation of the DPCM coder consists of calculating an estimated value $s_i$ on the basis of preceding sample values. From the difference between the occurring PCM signal values $s_i$ and the estimated value $s_i$, the difference $\Delta s_i$ is calculated which is first quantized and then transmitted. This quantized PCM signal value is referenced $\Delta s_{i,q}$. The time flow of the calculation of a DPCM signal value comprises four steps:

(1) up until the time $t_1$: calculation of $$\Delta s_i = s_i - s_i;$$

(2) up until the time $t_2$: quantization of $$\Delta s_i \rightarrow \Delta s_{i,q};$$

(3) up until the time $t_3$: addition of $$s_i + \Delta s_{i,q}; \text{ and}$$

(4) up until the time $t_4$: multiplication of $$A \cdot (s_i + \Delta s_{i,q}) = s_i + 1.$$

These four calculating steps must be executed within a time interval $t_A$ which corresponds to the interval of time between two consecutive PCM signal values $s_i$, $s_i+1$.

The illustration of the DPCM coder is purely schematic. Here, it has been assumed that the output signal of the circuit elements occurs at each of the times $t_1$—$t_4$. This can take place by the selection of suitable modules or by means of additional delay elements or suitable intermediate memories (bistable trigger stages).

The DPCM coder illustrated in FIG. 2 is constructed in accordance with the present invention and comprises a quantizer 4 which has three outputs $4_2$—$4_4$. The input $4_1$ of the quantizer 4 is preceded by three series-connected subtractors 1—3. An input $1_1$ of the first subtractor represents the input E of the circuit arrangement at which the PCM signal values which are to be processed occur. The first output $4_2$ of the quantizer 4 is connected to the second input $1_2$ of the first subtractor. The signal value which is to be subtracted occurs at each of the inputs of the subtractors which are referenced by the index 2. The second output $4_3$ of the quantizer 4 is connected to the input $3_2$ of the third subtractor and is connected by way of a calculating unit 10 to the input $2_2$ of the second subtractor. The calculating unit 10 contains an adder 5 whose first input $5_1$ is connected to the second output $4_3$ of the quantizer. The output $5_3$ of the adder 5 is connected to the first input $6_1$ of a first multiplier 6. The so-called prediction factor A occurs at the second input $6_2$ of the multiplier 6. This prediction factor A is smaller than or equal to 1. The output $6_3$ of the first multiplier 6 is connected to the second input $5_2$ of the adder 5 and to the first input $7_1$ of a second multiplier 7, which is likewise supplied with a prediction factor A at its second input $7_2$. The output $7_3$ of the second multiplier 7 represents the output of the calculating unit 10 and is connected to the subtraction input $2_2$ of the second subtractor 2.

The quantized DPCM signals $\Delta s_{i,q}$ are emitted from the third output $4_4$ of the quantizer. Here, the index q serves to indicate that a quantization error exists in respect of every output signal.

In order that the circuit arrangement may be explained relatively simply, it will again be assumed that all of the calculating elements and the quantizer are controlled by clock pulses, i.e. at a specific time their respective output emits the processed signal which remains until the next operating clock pulse. The PCM signal at the input E changes in accordance with an operating clock pulse $t_1$. A second operating clock pulse $t_2$ possesses the same period but is displaced in phase by 180°. The subtractors 1 and 3 and the adder 5 and the multiplier 7 each operate in accordance with the first operating clock pulse $t_1$, whereas all other calculating elements and the quantizer operate in accordance with the second operating clock pulse $t_2$. The circuit diagram represents the signals for the time interval following the operating clock pulse $t_1$. After the next operating clock pulse $t_2$ and quantized DPCM signal $\Delta s_i$ occurs at the output O of the quantizer.

Each estimated value $s_i$ is calculated on the basis of the preceding values. Therefore, the estimated value $s_i + 1$ is calculated from $$s_{i+1} = A(s_i + \Delta s_{i,q}) = A \cdot s_i + A \cdot \Delta s_{i,q}.$$

Accordingly, the estimated values $s_{i-1}$—$s_{i+n}$ are calculated from the preceding estimated values and quantized DPCM signals:

GL 2.0

$$s_{i-1} = A(s_{i-2} + \Delta s_{i-2,q})$$

GL 2.1

$$s_i = A(s_{i-1} + \Delta s_{i-1,q}) = A(A(s_{i-2} + \Delta s_{i-2,q}) + \Delta s_{i-1,q})$$

GL 2.2

$$s_{i+1} = A(s_i + \Delta s_{i,q}) = A(A(s_{i-1} + \Delta s_{i-1,q}) + \Delta s_{i,q})$$

GL 2.3

$$s_{i+n} = A(s_{i+n-1} + \Delta s_{i+n-1,q}) = A(A(s_{i+n-2} + \Delta s_{i+n-2,q})$$
$$+ \Delta s_{i+n-1,q}).$$

The calculation of the estimated value $s_{i+1}$ necessitates the difference $\Delta s_{i,q}$ produced directly beforehand, and the values $s_i - 1$ and $\Delta s_{i-1,q}$ (GL 2.2) which were available one time interval $t_A$ (this corresponds to the period between two consecutive PCM signal values $s_i$, $s_{i+1}$ at the input E of the DPCM coder) previously. Therefore, the circuit illustrated in FIG. 2 is designed in such a manner that the signal value $s_i + 1$ is already logically-linked to the values $\Delta s_{i-1,q}$ and $s_{i-1}$ before the DPCM signal value $\Delta s_i$ is calculated in a third loop.

In order to provide a more detailed explanation of the operation of the circuit, the PCM signal value $s_i$ will be followed from the input E to the output O of the DPCM coder. Prior to the time $t_{1,1}$ the PCM signal value $s_i$ is present at the input E of the first subtractor 1. The value $A^2 \cdot \Delta s_{i-2,q}$ emitted from the quantizer 4 is present at the subtraction input $1_2$ of the first subtractor. Following the next clock pulse $t_{1,1}$ the intermediate value:

$$GL 3.1 Z_{i,1} = s_i - A^2 \Delta s_{i-2,q}$$

is emitted from the output $1_3$ of the first subtractor.

Now, the intermediate value $Z_{i,1}$ which has just been calculated is present at the inputs of the second subtractor 2 and by way of an intermediate value $A^2 \cdot s_{i-2}$ is present at the second input, where A is the prediction factor $<1$. Following the next clock pulse $t_{2,1}$ a second intermediate value $Z_{i,2}$ therefore occurs at the output of the second subtractor:

$$GL3.2\ Z_{i,2} = s_i - A^2 \Delta s_{i-2,q} - A^2 s_{i-2}.$$

With the equation GL 2.0:

$$GL3.21\ Z_{i,2} = s_i - \Delta s_{i-1}.$$

Following the operating clock pulse $t_{2,1}$ the quoted calculated value $A \cdot \Delta s_{i-1,q}$ is already present at the second output $4_3$ of the quantizer 4. Therefore, following the next operating clock pulse $t_{1,2}$ the third intermediate value $Z_{i,3}$ occurs at the output of the third subtractor 3:

$$GL3.3\ Z_{i,3} = s_i - A s_{i-1} - A \cdot \Delta s_{i-1,q}.$$

With the equation GL2.1, for $z_{i,3}$ one has:

$$GL3.31\ Z_{i,3} = s_i - s_i = \Delta s_i.$$

The third intermediate value $Z_{i,3}$ therefore corresponds to the DPCM signal value $\Delta s_i$. As already mentioned, all of the calculated values and intermediate values in FIG. 2 are provided for this time. Following the next operating clock pulse $t_{2,2}$ the quantized DPCM signal $\Delta s_{i,q}$ occurs at the output O of the DPCM coder. The signal values entered on FIG. 2 relate to the time $t_{1,2}$. The circuit arrangement can be constructed either from clock pulse controlled calculating elements or from calculating elements which are not clock pulse controlled. When there is no clock pulse control for the calculating elements, it is, of course, necessary to take into account the delay times and, possibly by the connection of delay elements for example in respect of the calculation of the estimated value $s_i$ in the calculating unit 10. The mixed use of clock pulse control and non-clock pulse controlled calculating elements can likewise produce favorable results.

A DPCM decoder can, of course, be constructed in accordance with the same principle.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A high-speed difference pulse code modulation (DPCM) coder, comprising:
   first, second and third subtractors each including an output and first and second inputs, said first input of said first subtractor serving as the input of said coder, for receiving PCM input signals to be coded, said output of said first subtractor connected to said first input of said second subtractor and said output of said second subtractor connected to said first input of said third subtractor;
   a quantizer including an input connected to said output of said third subtractor, and at least a first output and a second output, and operable to emit at said first output a first calculation value ($A^2 \cdot \Delta s_{i,q}$) including a quantized DPCM signal value ($\Delta s_{i,q}$) multiplied by the square of a prediction factor (A) and to emit at said second output a second calculation value ($A \cdot \Delta s_{i,q}$) including the quantized DPCM signal value ($\Delta s_{i,q}$) multiplied by the prediction factor (A), said first output of said quantizer connected to said second input of said first subtractor and said second output of said quantizer connected to said second input of said third subtractor, where i indicates an index for a chronological sequence of signal values and q represents quantization; and
   a calculating unit comprising an input connected to said second output of said quantizer to receive the second quantized DPCM signal and an output connected to said second input of said second subtractor and operable to produce at said output a signal ($A^2 \cdot s_i$) including a predicted value ($s_i$) multiplied by the square of the prediction factor (A).

2. The high-speed difference pulse code modulation (DPCM) coder of claim 1, wherein said quantizer further comprises:
   a third output for emitting the quantized DPCM signal values ($\Delta s_{i,q}$).

3. The high-speed difference pulse code modulation (DPCM) coder of claim 1, and further comprising:
   a multiplier connected to said first output of said multiplier and is operable to multiply the first calculation value ($A^2 \cdot \Delta s_{i,q}$) by the factor ($1/A^2$) to obtain the quantized DPCM signal value ($\Delta s_{i,q}$).

4. The high-speed difference pulse code modulation (DPCM) coder of claim 1, and further comprising:
   a multiplier connected to said second output of said multiplier and is operable to multiply the second calculation value ($A \cdot \Delta s_{i,q}$) by the factor ($1/A$) to obtain the quantized signal ($\Delta s_{i,q}$).

5. The high-speed difference pulse code modulation (DPCM) coder of claim 1, wherein said calculating unit comprises:
   an adder, a first multiplier and a second multiplier each including first and second inputs and an output,
   said first input of said adder connected to said second output of said quantizer, said second input of said adder connected to said output of said first multiplier, and said output of said adder connected to said first input of said multiplier,
   said second inputs of said first and second multipliers connected to receive the prediction factor (A),
   said output of said first multiplier connected to said first input of said second multiplier, and
   said output of said second multiplier connected to said second input of said second subtractor.

6. A high-speed difference pulse code modulation (DPCM) coder, comprising:
   first, second and third adders each including an output and first and second inputs, said first input of said first adder serving as the input of said coder for receiving input signals to be coded, said output of said first adder connected to said first input of said second adder and said output of said second adder connected to said first input of said third adder;
   quantizer means including an input connected to said output of said third adder, and first and second outputs and inversion means and operable to emit at said first output a first calculation value ($A^2 \cdot$ $\Delta s_{i,q}$) including a quantized DPCM signal value ($\Delta s_{i,q}$) multiplied by the square of a prediction factor (A) and to emit at said second output a second calculation value ($A \cdot \Delta s_{i,q}$) including the quantized DPCM signal value ($\Delta s_{i,q}$) multiplied the prediction factor (A), said first output of said quantizer means connected to said second input of said first adder and said second output of said quantizer means connected to said second input of said third adder, where i represents an index for a chronological sequence of signal values and q represents quantization; and a calculating unit comprising an input connected to said second output of said quantizer means to receive the second quantized DPCM signal and an output connected to said second input of said second adder and operable to produce at said output a signal ($A^2 \cdot s_i$) including, a predicted value ($s_i$) multiplied by the square of the prediction factor (A).

* * * * *